United States Patent
Matsui

(10) Patent No.: US 8,159,045 B2
(45) Date of Patent: Apr. 17, 2012

(54) SEMICONDUCTOR DEVICE WITH SHIELD LINE DISPOSED BETWEEN CAPACITORS

(75) Inventor: Koujirou Matsui, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 55 days.

(21) Appl. No.: 12/591,882

(22) Filed: Dec. 3, 2009

(65) Prior Publication Data
US 2010/0140740 A1    Jun. 10, 2010

(30) Foreign Application Priority Data
Dec. 9, 2008 (JP) ................................ 2008-313662

(51) Int. Cl.
*H01L 21/02* (2006.01)
(52) U.S. Cl. .................... 257/532; 257/535; 438/957
(58) Field of Classification Search ............ 257/65–665, 257/E27.489, E27.048; 438/238, 239, 386, 438/399, 957
See application file for complete search history.

(56) References Cited

U.S. PATENT DOCUMENTS

| 5,729,047 A * | 3/1998 | Ma ............................. 257/664 |
| 2003/0089937 A1 | 5/2003 | Yamauchi et al. |
| 2006/0289917 A1 | 12/2006 | Fujiwara et al. |

FOREIGN PATENT DOCUMENTS

| JP | 2003-152085 A | 5/2003 |
| JP | 2004-146632 A | 5/2004 |
| JP | 2007-5719 A | 1/2007 |
| JP | 2007-184324 A | 7/2007 |

* cited by examiner

*Primary Examiner* — David Vu
(74) *Attorney, Agent, or Firm* — McGinn IP Law Group, PLLC

(57) ABSTRACT

A semiconductor device includes: a first capacitor including an upper electrode, a lower electrode, an intermediate electrode arranged between the upper electrode and the lower electrode, and a shield line arranged in the same layer as the intermediate electrode; and a second capacitor, including an upper electrode, a lower electrode, and an intermediate electrode arranged between the upper electrode and the lower electrode, and arranged adjoining to the first capacitor. In the first capacitor and the second capacitor, the upper electrode, the lower electrode and the shield line are electrically connected to a ground electrode. The shield line lies between the first capacitor and the second capacitor. Accordingly, a MIM capacitor with excellent layout efficiency is provided while noise effects are reduced.

18 Claims, 18 Drawing Sheets

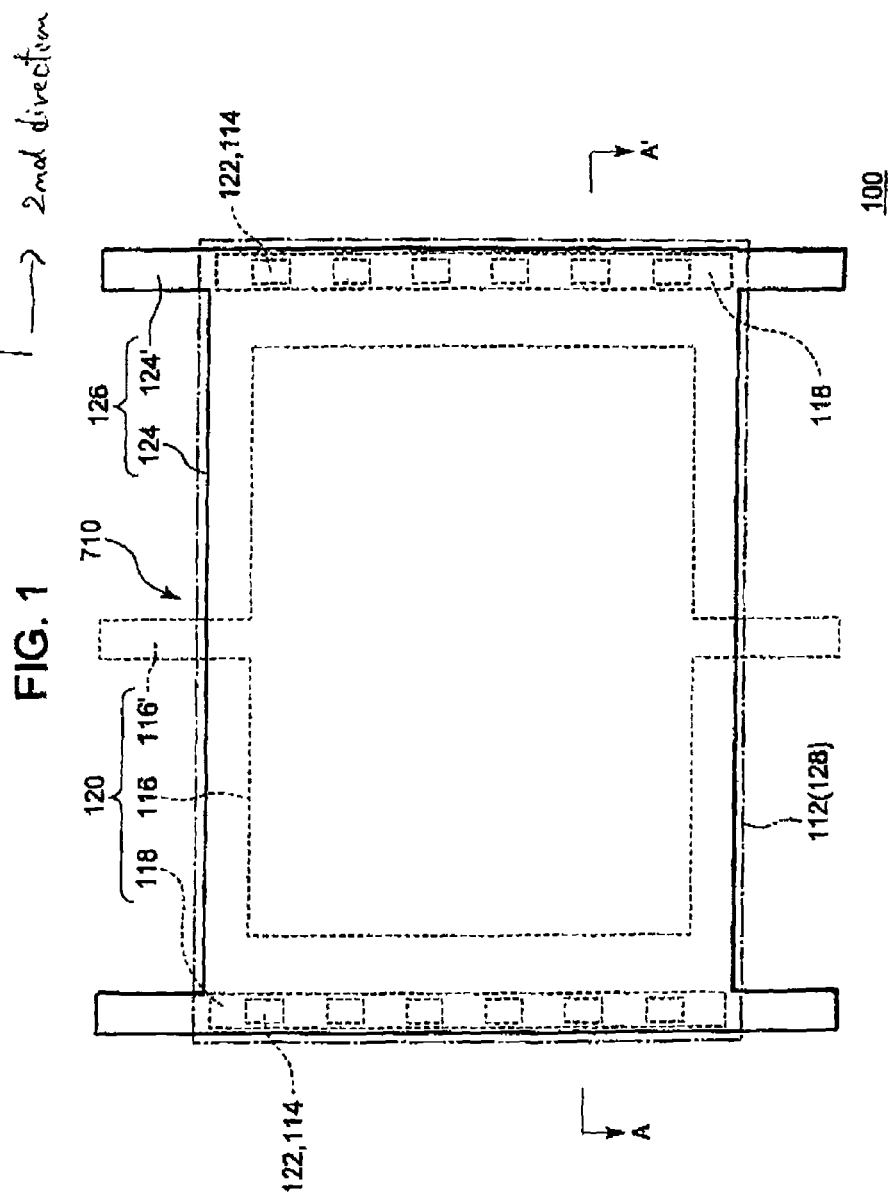

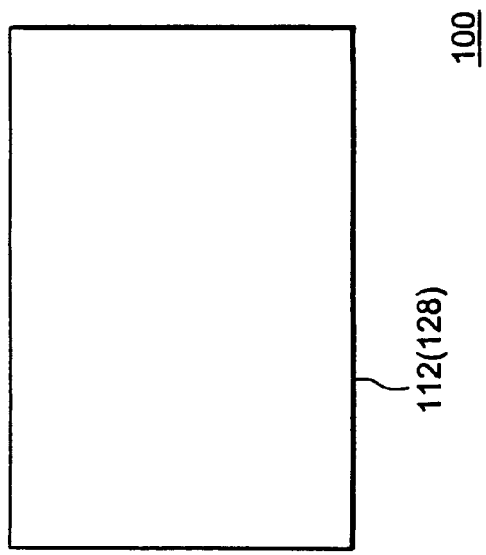
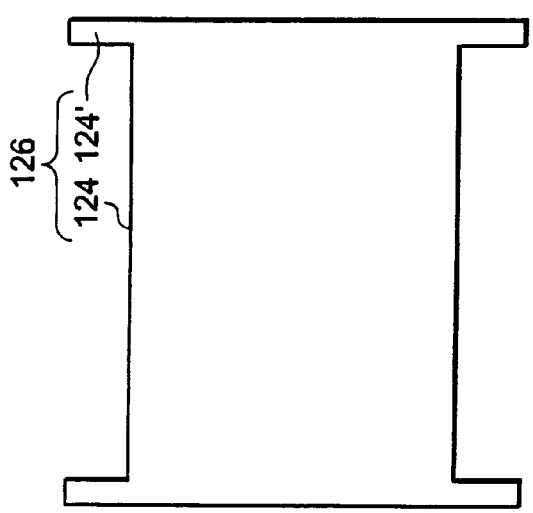
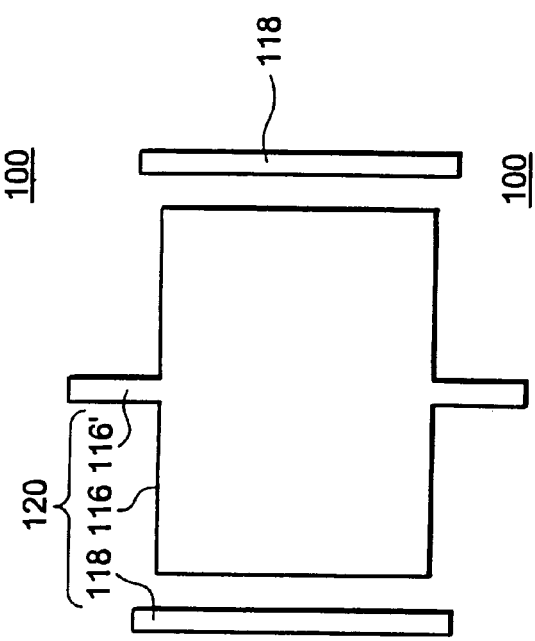
FIG. 2C
FIG. 2A
FIG. 2B

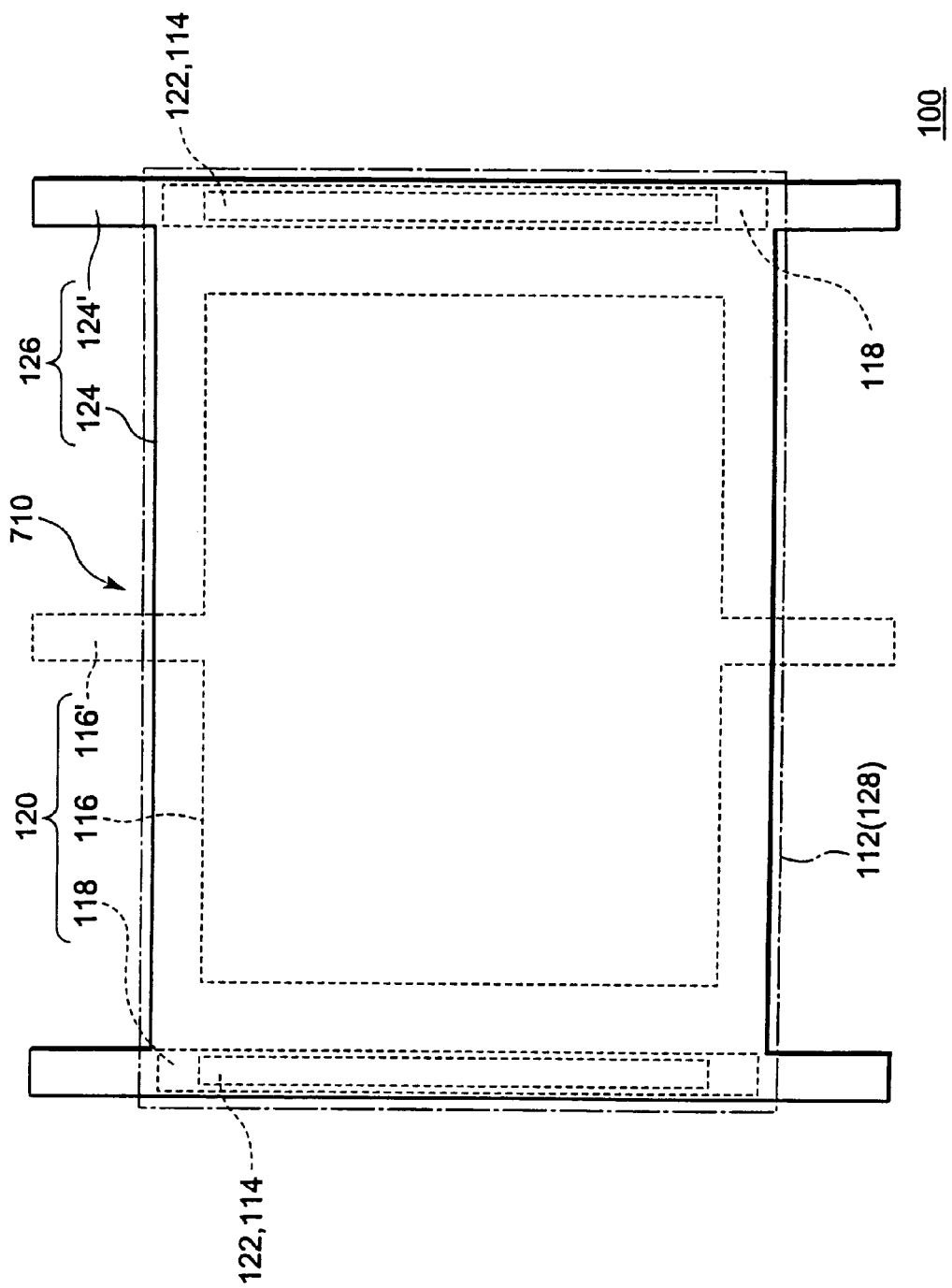

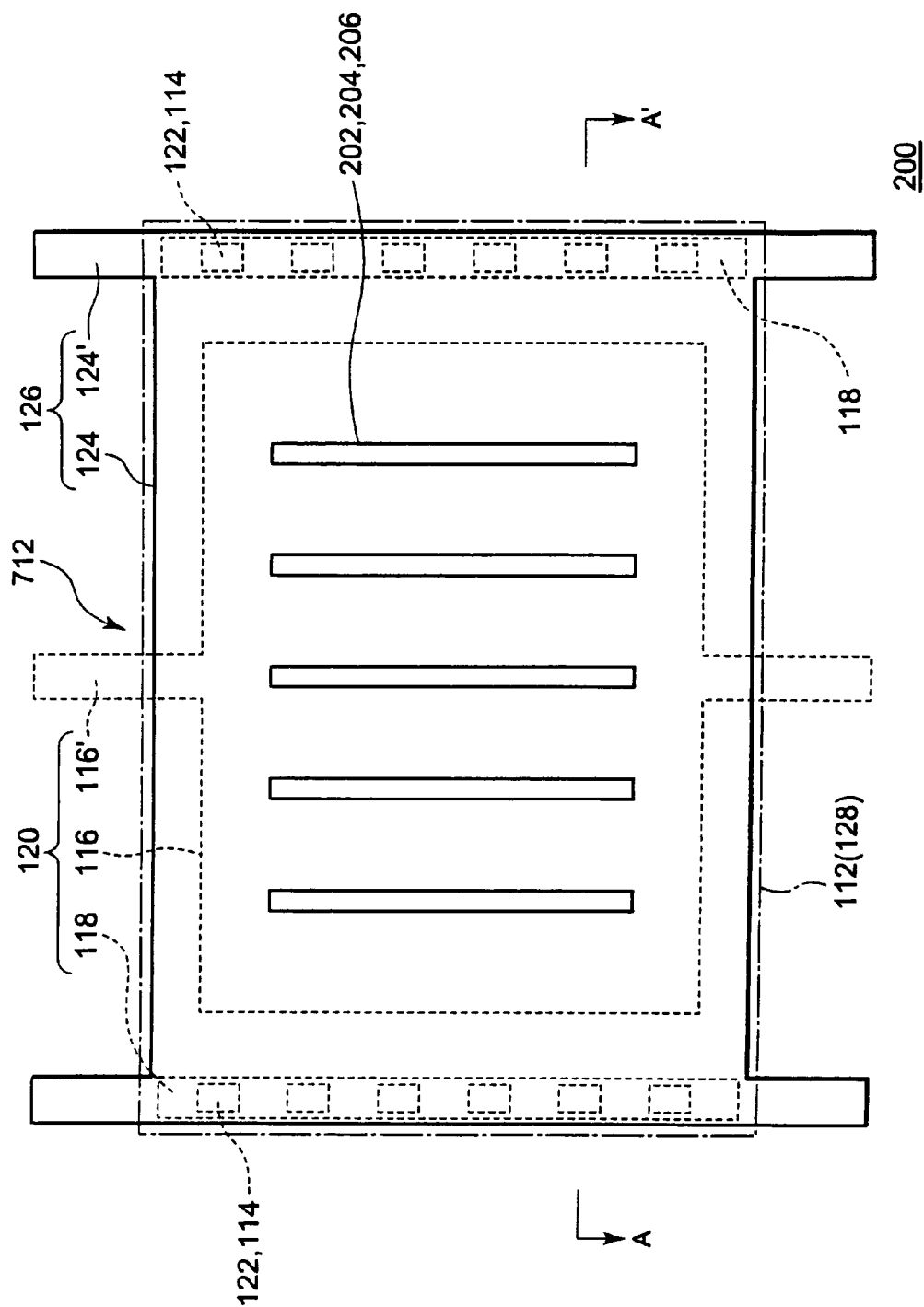

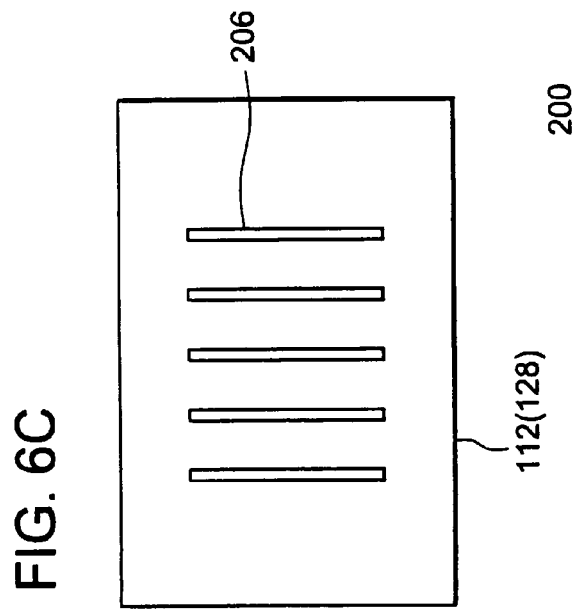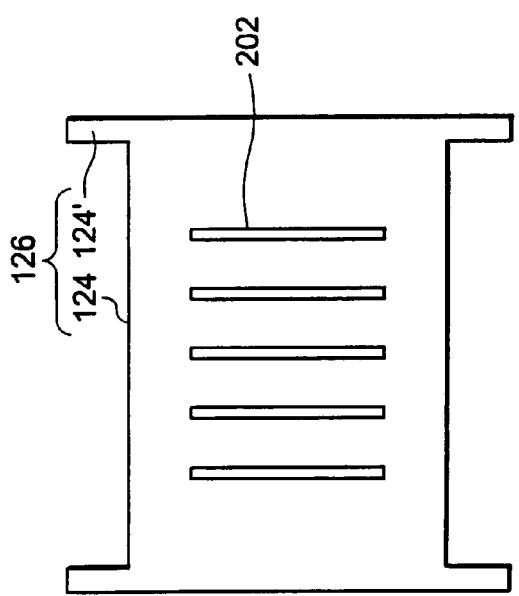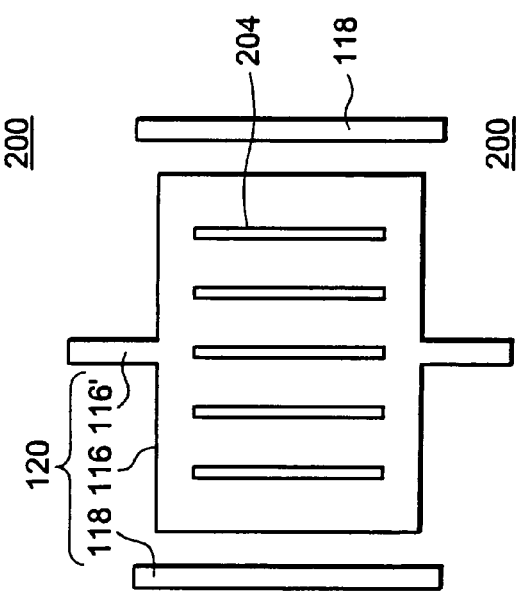

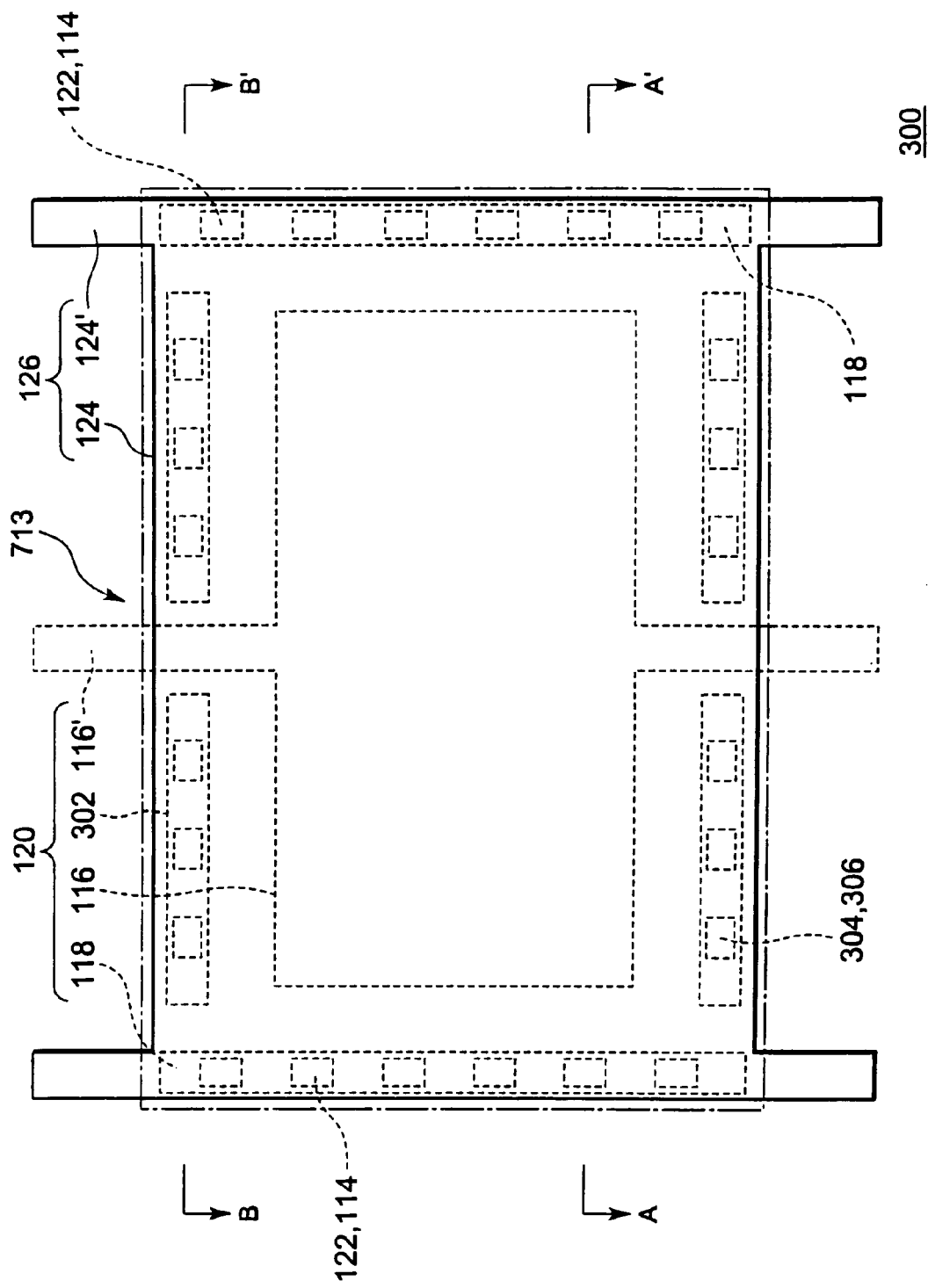

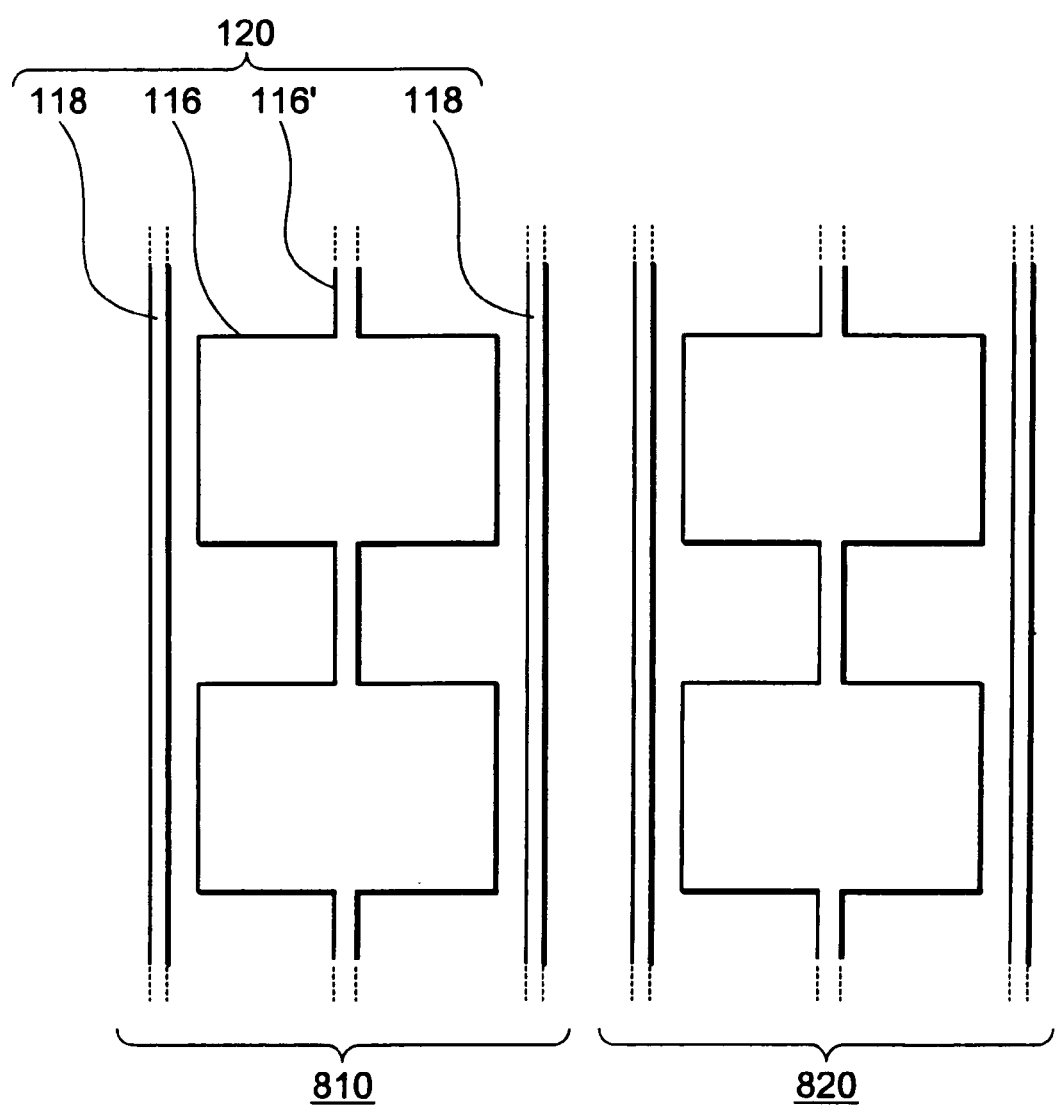

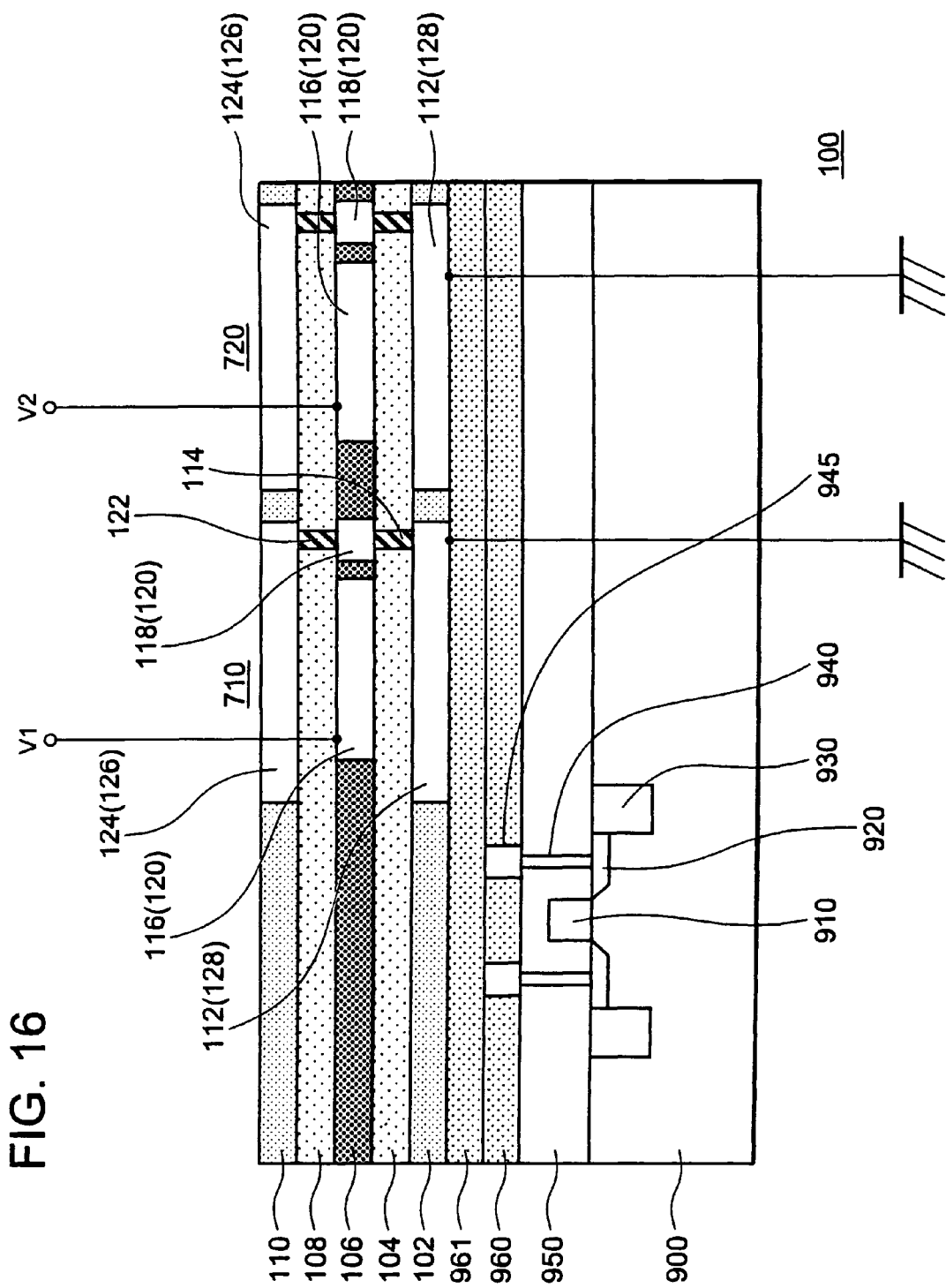

SEMICONDUCTOR DEVICE WITH SHIELD LINE DISPOSED BETWEEN CAPACITORS

This application is based upon and claims the benefit of priority from Japanese Patent Application No. 2008-313662, the disclosure of which is incorporated herein in its entirety by reference.

BACKGROUND OF THE INVENTION

The present invention relates to a semiconductor device, and more particularly to a semiconductor device with a high-precision capacitor.

Some semiconductor devices with an analog circuit require a high precision for capacitance ratio between multiple capacitors.

Japanese Patent Laid-Open No. 2004-146632 describes a technique by which a dummy line is formed in the same layer as an upper electrode and a lower electrode of a MIM (Metal-Insulator-Metal) capacitor, and a dummy line is also formed above the upper electrode and below the lower electrode, and these dummy lines are connected to the ground, whereby effects of noise on the capacitor are reduced.

Japanese Patent Laid-Open No. 2003-152085 describes a technique by which an upper shield layer is arranged above an upper electrode of a MIM capacitor, and a lower shield layer is arranged below a lower electrode, and the upper shield layer and the lower shield layer are connected via a via, whereby coupling of noise to the capacitor is prevented.

Further, Japanese Patent Laid-Open No. 2007-5719 describes a technique in which a MIM capacitor is used which includes an upper electrode, intermediate electrode and lower electrode, the upper electrode and the lower electrode being connected via a via, so that while the area occupied by the capacitor is reduced, parasitic capacitance of the capacitor is reduced.

Further, Japanese Patent Laid-Open No. 2007-184324 describes a capacitor including an intermediate electrode arranged between an upper electrode and lower electrode connected to a ground pad.

However, the above documents disclose neither a structure of capacitor in which, while excellent layout efficiency is kept, effects of noise from the capacitor is suppressed, nor arrangement of the capacitor, nor a method of connecting the capacitor.

SUMMARY

According to the present invention, a semiconductor device is provided which comprises:

a first capacitor including a first upper electrode, a first lower electrode, a first intermediate electrode arranged between the first upper electrode and the first lower electrode, and a first shield line in the same layer as the first intermediate electrode; and a second capacitor, including a second upper electrode, a second lower electrode and a second intermediate electrode arranged between the second upper electrode and the second lower electrode, and arranged adjoining to the first capacitor, wherein in the first capacitor and the second capacitor, the first upper electrode, the first lower electrode, the second upper electrode, the second lower electrode and the first shield line are electrically connected to a ground electrode, and wherein the first shield line is arranged between the first capacitor and the second capacitor.

According to the present invention, the two independently working capacitors each includes the upper and lower electrodes having a fixed electrical potential, and the first shield line acting as a shield between the respective intermediate electrodes is further provided, so arrangement and connection structure of multiple capacitors are provided by which noise is reduced while excellent layout efficiency is kept.

BRIEF DESCRIPTION OF THE DRAWINGS

The above and other objects, advantages and features of the present invention will be more apparent from the following description taken in conjunction with the accompanying drawings, in which:

FIG. 1 is a plan view illustrating a semiconductor device according to a first embodiment of the present invention;

FIGS. 2A to 2C are plan views illustrating each of wiring layers of the semiconductor device according to the first embodiment of the present invention;

FIG. 4 is a plan view illustrating a variation of the semiconductor device according to the first embodiment of the present invention;

FIG. 5 is a plan view illustrating a semiconductor device according to a second embodiment of the present invention;

FIGS. 6A to 6C are plan views illustrating each of wiring layers of the semiconductor device according to the second embodiment of the present invention;

FIG. 9 is a plan view illustrating a semiconductor device according to a third embodiment of the present invention;

FIG. 15 is a plan view illustrating a variation of the semiconductor device according to the fourth embodiment of the present invention; and FIG. 16 is a cross-sectional view illustrating the semiconductor device according to the first embodiment of the present invention.

DETAILED DESCRIPTION OF PREFERRED EMBODIMENTS

Figure 3:
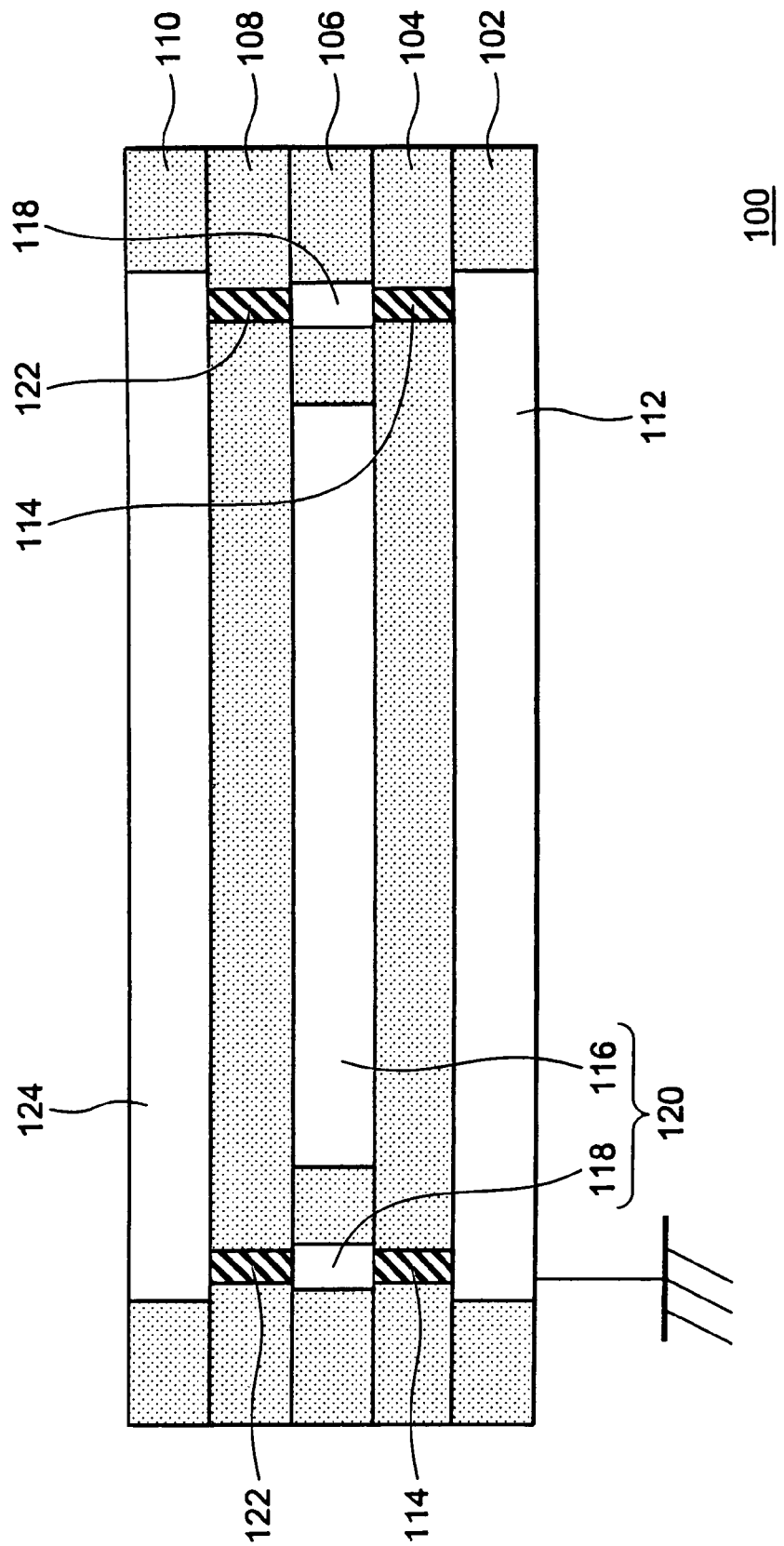
FIG. 3 is a cross-sectional view illustrating the semiconductor device according to the first embodiment of the present invention.

The invention will be now described herein with reference to illustrative embodiments.

Those skilled in the art will recognize that many alternative embodiments can be accomplished using the teachings of the present invention and that the invention is not limited to the embodiments illustrated for explanatory purposes.

First Embodiment

FIGS. 1 to 3 and 16 are views for describing a first embodiment of the present invention. Referring to FIG. 16, a transistor composed of a gate 910, a diffusion layer 920 and an element separation 930, and other parts are constructed on a substrate 900 of a semiconductor device 100; and a contact 940, a line 945 and the like are formed in insulating films 950 and 960. A first wiring layer 128 including a lower electrode 112 is buried in a first interlayer insulating film 102 on an insulating film 961.

The semiconductor device 100 according to the first embodiment of the present invention comprises: a first capacitor 710 including an upper electrode 124, a lower electrode 112, an intermediate electrode 116 arranged between the upper electrode 124 and the lower electrode 112, and a first shield line 118 arranged in the same layer as the intermediate electrode 116; and a second capacitor 720, including an upper electrode 124, a lower electrode 112, and an intermediate electrode 116 arranged between the upper electrode 124 and the lower electrode 112, and arranged adjoining to the first capacitor. In the first capacitor 710 and the second capacitor 720, the upper electrode 124, the lower electrode 112 and the first shield line 118 are electrically connected to a ground electrode.

The first shield line 118 is arranged between the first capacitor 710 and the second capacitor 720.

FIG. 1 is a plan view illustrating the semiconductor device 100 including the first capacitor 710 according to the first embodiment of the present invention; FIGS. 2A to 2C are plan views illustrating each of the wiring layers; and FIG. 3 is a cross-sectional view along the line A-A' of FIG. 1.

Here, the shield line 118 is arranged between the intermediate electrodes of the adjoining capacitors.

Each capacitor of FIG. 16 corresponds to an example in which the shield line 118 is provided to the right side of the intermediate electrode 116 in the figure, and the capacitors of FIGS. 1 to 3 correspond to an example in which the shield line 118 is provided to both sides of the intermediate electrode 116 in the figure.

The first capacitor 710 of the semiconductor device 100 according to the first embodiment of the present invention will be described below with reference to FIGS. 1 to 3.

Referring to FIGS. 1 to 3, the semiconductor device 100 includes:

the first interlayer insulating film 102 arranged on the semiconductor substrate (not illustrated) such as a silicon substrate;

a second interlayer insulating film 104 arranged on the first interlayer insulating film 102;

a third interlayer insulating film 106 arranged on the second interlayer insulating film 104;

a fourth interlayer insulating film 108 arranged on the third interlayer insulating film 106; and a fifth interlayer insulating film 110 arranged on the fourth interlayer insulating film 108.

The first wiring layer 128 including the lower electrode 112 is buried in the first interlayer insulating film 102. The lower electrode 112 is composed of copper or metal alloy made mainly of copper, for example. The first interlayer insulating film 102 is composed of silicon oxide film or low-k film, for example. A second wiring layer 120 is buried in the third interlayer insulating film 106. The second wiring layer 120 includes the intermediate electrode 116, an intermediate electrode withdrawing line 116' and the first shield line 118. The intermediate electrode 116, the intermediate electrode withdrawing line 116' and the first shield line 118 are composed of copper or metal alloy made mainly of copper, for example. The third interlayer insulating film 106 is composed of silicon oxide film or low-k film, for example. A third wiring layer 126 is buried in the fifth interlayer insulating film 110. The third wiring layer 126 includes the upper electrode 124 and an upper electrode withdrawing line 124'. The upper electrode 124 and the upper electrode withdrawing line 124' are composed of copper or metal alloy made mainly of copper, for example. The fifth interlayer insulating film 110 is composed of silicon oxide film or low-k film, for example. The intermediate electrode 116 and the intermediate electrode withdrawing line 116' are electrically connected. The upper electrode 124 and the upper electrode withdrawing line 124' are electrically connected. The first shield line 118 and the intermediate electrode 116 are electrically insulated from each other by the third interlayer insulating film 106. The first shield line 118 is arranged to both sides of the intermediate electrode 116 in a manner extending in a direction parallel to the intermediate electrode withdrawing line 116'.

A first via 114 is buried in the second interlayer insulating film 104. The first via 114 is used to electrically connect the lower electrode 112 and the first shield line 118. The first via 114 is composed of copper or metal alloy made mainly of copper, for example. The second interlayer insulating film 104 is composed of silicon oxide film or low-k film, for example. A second via 122 is buried in the fourth interlayer insulating film 108. The second via 122 is used to electrically connect the upper electrode 124 and the first shield line 118. The second via 122 is composed of copper or metal alloy made mainly of copper, for example. The fourth interlayer insulating film 108 is composed of silicon oxide film or low-k film, for example.

The lower electrode 112, the second interlayer insulating film 104, the intermediate electrode 116, the fourth interlayer insulating film 108 and the upper electrode 124 constitute the first capacitor 710. The lower electrode 112 and the upper electrode 124 each act as an electrode of the first capacitor 710; the intermediate electrode 116 acts as another electrode of the first capacitor 710; and the second interlayer insulating film 104 and the fourth interlayer insulating film 108 each act as a capacitor dielectric.

The first shield line 118, the lower electrode 112 and the upper electrode 124 are connected to the ground electrode.

Accordingly, the potentials of the first shield line 118, the lower electrode 112 and the upper electrode 124 are fixed; thus the first shield line 118, the lower electrode 112 and the upper electrode 124 work as a shield against external noise to the intermediate electrode 116. Further, the first shield line 118 suppresses, as illustrated in FIG. 16, noise produced in the intermediate electrode 116 of the first capacitor 710 from affecting the second intermediate electrode 116 of the adjoining second capacitor 720.

According to the present embodiment, the lower electrode 112 is connected to the ground electrode and further, the lower electrode 112, the first shield line 118 and the upper electrode 124 are connected via the first via 114 and the second via 122. Accordingly, the first shield line 118 is formed to sandwich the intermediate electrode 116 and further, the first via 114 and the second via 122 with a fixed potential are provided, whereby arrangement is made to surround the intermediate electrode 116. Thus, greater shield effects are provided against external noise to the intermediate electrode 116 of the first capacitor 710 and against noise spreading from the intermediate electrode 116 of the first capacitor 710 to the outside.

The upper electrode withdrawing line 124' electrically connected to the upper electrode 124 acts as a withdrawing line from one of the electrodes of the capacitor 710; and the intermediate electrode withdrawing line 116' electrically connected to the intermediate electrode 116 acts as a withdrawing line from the other of the electrodes of the capacitor 710.

The respective intermediate electrodes of the capacitor 710 and the capacitor 720 may be insulated from each other. When a different potential is, as illustrated in FIG. 16, applied to the capacitor 710 and the capacitor 720, the capacitor 710 and the capacitor 720 can function as a separate capacitor.

FIG. 2 is a view illustrating each of the wiring layers of FIG. 1. FIG. 2A illustrates the third wiring layer 126; the FIG. 2B illustrates the second wiring layer 120; and FIG. 2C illustrates the first wiring layer 128. The third wiring layer 126 of FIG. 2A includes the upper electrode 124 and the upper electrode withdrawing line 124' and is arranged above the second wiring layer 120 of FIG. 2B. The second wiring layer 120 of FIG. 2B includes the intermediate electrode 116 and the intermediate electrode withdrawing line 116' and the first shield line 118 is arranged above the first wiring layer 128 of FIG. 2C. The first wiring layer 128 of FIG. 2C includes the lower electrode 112 and is arranged below the second wiring layer 120 of FIG. 2B.

The semiconductor device 100 illustrated in FIGS. 1 to 3 can be formed by a known dual damascene process or single damascene process. The first wiring layer 128 may include a line in a circuit region other than the formation region of the capacitor, and the second wiring layer 120 may include a line in a circuit region other than the formation region of the capacitor, and the third wiring layer 126 may include a line in a circuit region other than the formation region of the capacitor.

According to the present embodiment, the first via 114, the second via 122, the lower electrode 112, the upper electrode 124 and the first shield line 118, which are electrically connected to the ground electrode, three-dimensionally surround the intermediate electrode 116; thus, effects of external noise on the MIM capacitor is further reduced. Also, the upper electrode 124 and the lower electrode 112 acting as a shield layer can contribute to the capacitance value of the capacitor; thus, layout efficiency is raised.

In the first capacitor 710 according to the present embodiment, the first shield line 118 extends in a direction parallel to a given side of the intermediate electrode 116 as seen from the direction of a normal line to the electrode surface. When the given side of the intermediate electrode is not linear, the first shield line 118 is preferably formed along that side. Further, the contour of the first shield line 118 in the side facing the intermediate electrode 116 is formed so that at least a part thereof is positioned in the inner side of the contour of the upper electrode. As a result, higher shield effects and excellent layout efficiency are achieved.

In the present embodiment, the first capacitor 710 and the second capacitor 720 have the same structure. A layout method may be used in which a unit structure of the capacitor is first determined in which the dimensions of each of the electrodes and lines and their relative positions are fixed, and thereafter the unit structure is repeatedly used so that a required number of unit structures are arranged at regular intervals. Since the capacitor having the same structure is repeatedly used, the design is facilitated and the manufacturing accuracy of the individual capacitor is improved, so that a high capacitor precision is achieved.

In the present embodiment, the first shield lines 118 are arranged in both sides of the two capacitors. However, for example in FIG. 1, of the four sides of the intermediate electrode 116 of the capacitor 710, when a side facing the capacitor 720 is referred to as a first side and a side opposite the first side of the intermediate electrode 116 is referred to as a second side, when the first shield line 118 is arranged facing the first side of the intermediate electrode 116 of the capacitor 710, effects of shield between the intermediate electrode 116 of the capacitor 720 and that of the capacitor 710 are provided. Particularly, when the repeated layout is made, for example, the intermediate electrode 116 of the capacitor 720 lies between the first shield line 118 formed along the side of the capacitor 710 and the second shield line 118 of the capacitor 720; thus the first shield line 118 of the capacitor 710 acts not only as a shield of the intermediate electrode 116 of the capacitor 710 but also as a shield of the intermediate electrode 116 of the capacitor 720. Consequently, excellent layout efficiency is achieved while higher shield effects are provided.

In the present embodiment, the vias 114 and 122 are each constituted of multiple rectangular vias. However, the vias 114 and 122 may be, as illustrated in FIG. 4, constituted of slit-shaped vias. In this case, effects of external noise on the capacitor are further reduced.

Second Embodiment

Figure 7:
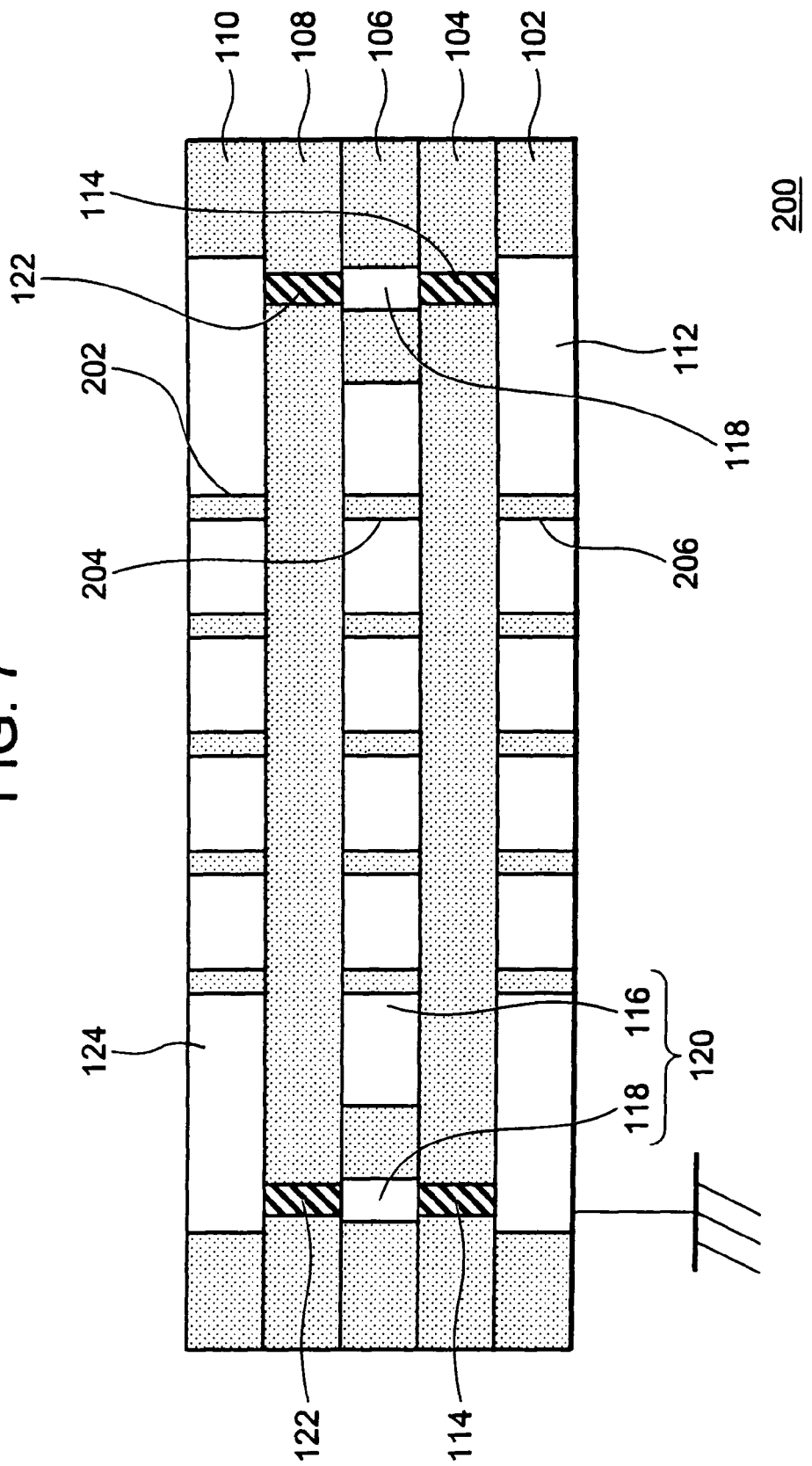
FIG. 7 is a cross-sectional view illustrating the semiconductor device according to the second embodiment of the present invention.

FIGS. 5 to 7 are views showing a second embodiment of the present invention. FIG. 5 is a plan view illustrating a semiconductor device 200 including a first capacitor 712 according to the second embodiment of the present invention; FIGS. 6A to 6C are plan views illustrating each of the wiring layers; and FIG. 7 is a cross-sectional view along the line A-A' of FIG. 5.

The difference of the second embodiment from the first embodiment lies in that the upper electrode 124, the intermediate electrode 116 and the lower electrode 112 constituting the first capacitor 712 have slit-shaped hollows 202, 204 and 206. An explanation of other aspects not different from the first embodiment is omitted.

The upper electrode 124 included in the third wiring layer 126 has, as illustrated in FIGS. 5 and 6A, the slit-shaped hollow 202; and this part of the slit-shaped hollow 202 is, as illustrated in FIG. 7, composed of the fifth interlayer insulating film 110.

The intermediate electrode 116 included in the second wiring layer 120 has, as illustrated in FIGS. 5 and 6B, the slit-shaped hollow 204; and this part of the slit-shaped hollow 204, as illustrated in FIG. 7, is composed of the third interlayer insulating film 106.

The lower electrode 112 included in the first wiring layer 128 has, as illustrated in FIGS. 5 and 6C, the slit-shaped hollow 206; and this part of the slit-shaped hollow 206 is, as illustrated in FIG. 7, composed of the first interlayer insulating film 102.

Similarly to the first embodiment, the semiconductor device 200 according to the present embodiment can be formed by a known dual damascene process or single damascene process. In the damascene process, planarization by CMP (Chemical Mechanical Polishing) is used in a wiring forming process. When the planarization process by CMP is used, when a slit-shaped hollow is arranged in a wiring pattern having a large area, the planarity of the upper surface of the wiring is improved. Consequently, when slit-shaped hollows are arranged in each of the electrodes constituting the MIM capacitor, the planarity of the upper surfaces of the electrodes is improved, so the accuracy of capacitance value of the MIM capacitor is improved.

Figure 8:
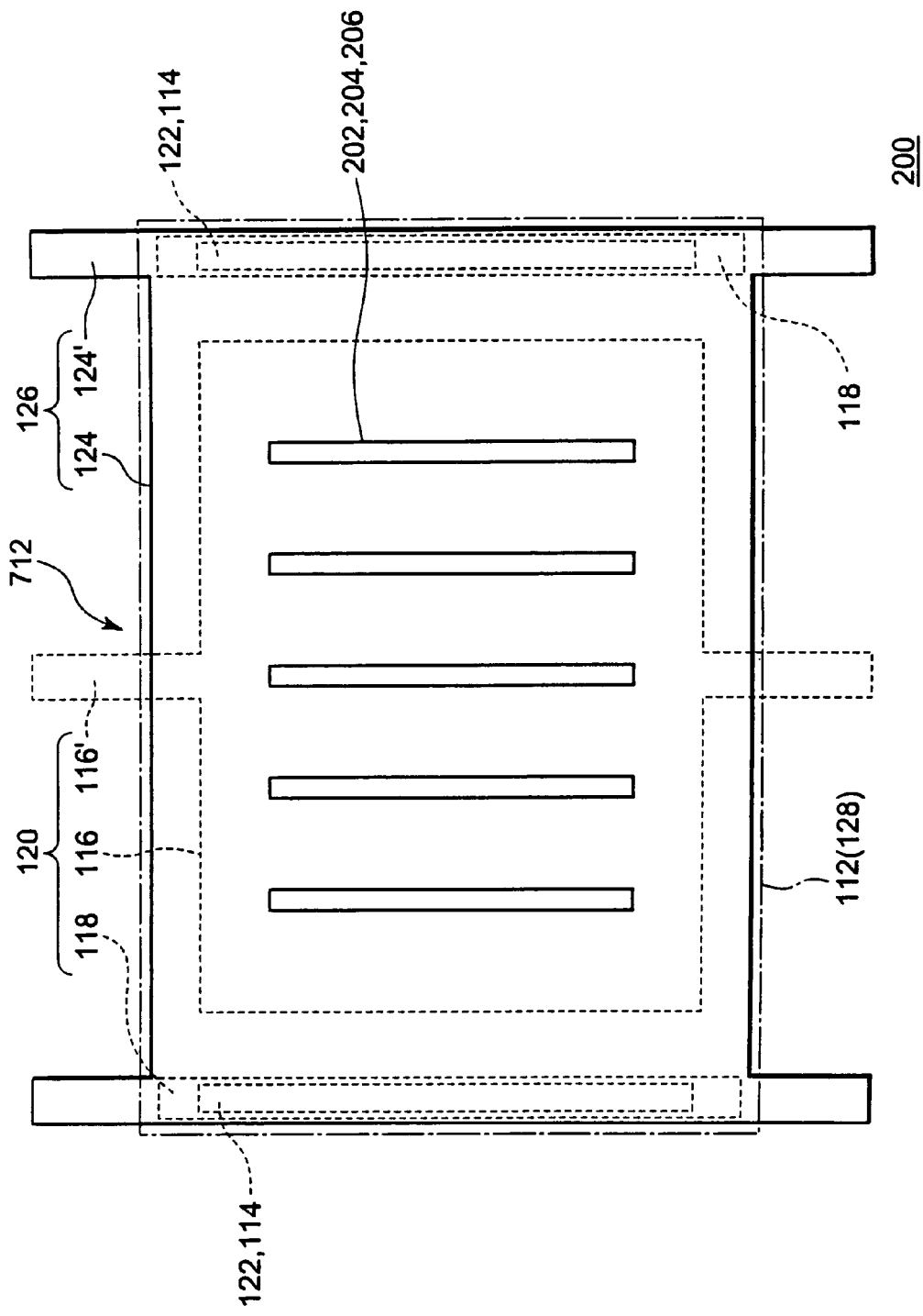
FIG. 8 is a plan view illustrating a variation of the semiconductor device according to the second embodiment of the present invention.
Figure 10C:
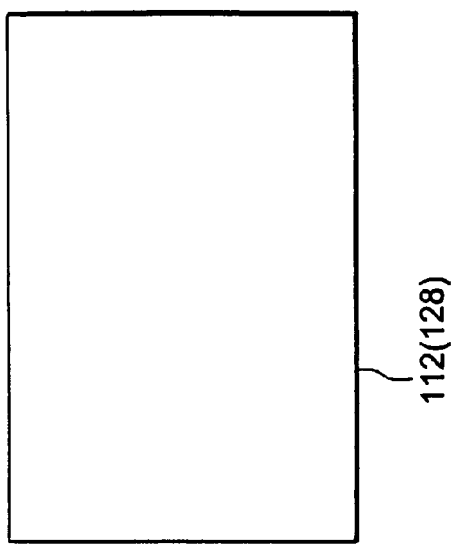
FIGS. 10A to 10C are plan views illustrating each of wiring layers of the semiconductor device according to the third embodiment of the present invention.
Figure 10A:
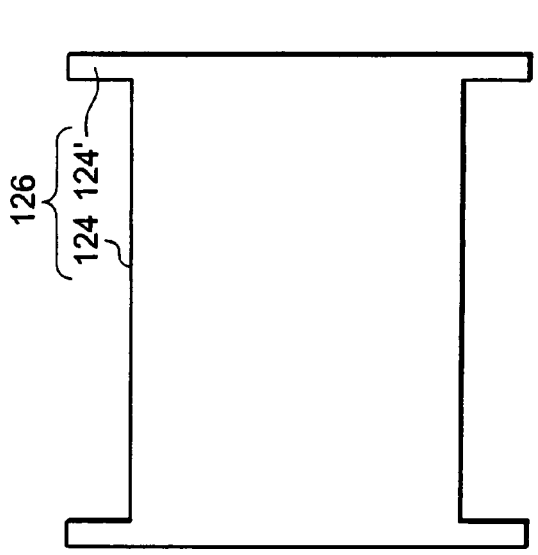
Figure 10B:
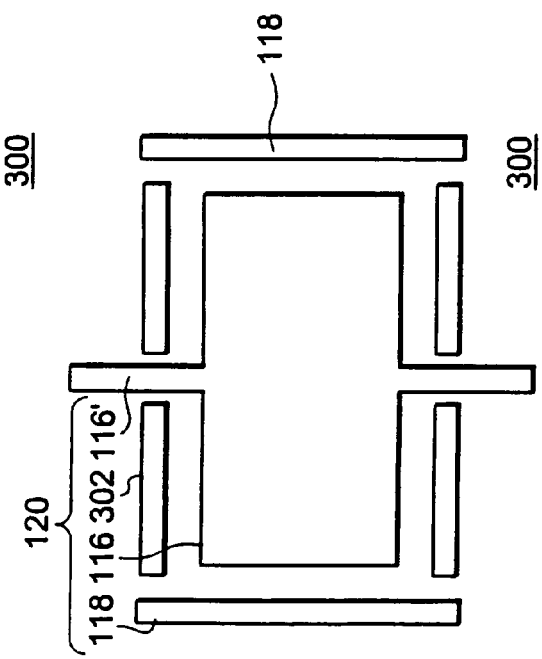

In the present embodiment, also, the vias 114 and 122 are each constituted of multiple rectangular vias. However, the vias 114 and 122 may be, as illustrated in FIG. 8, constituted of slit-shaped vias. When the vias 114 and 122 are constituted of slit-shaped vias, effects of external noise on the capacitor are further reduced.

Third Embodiment

Figure 11:
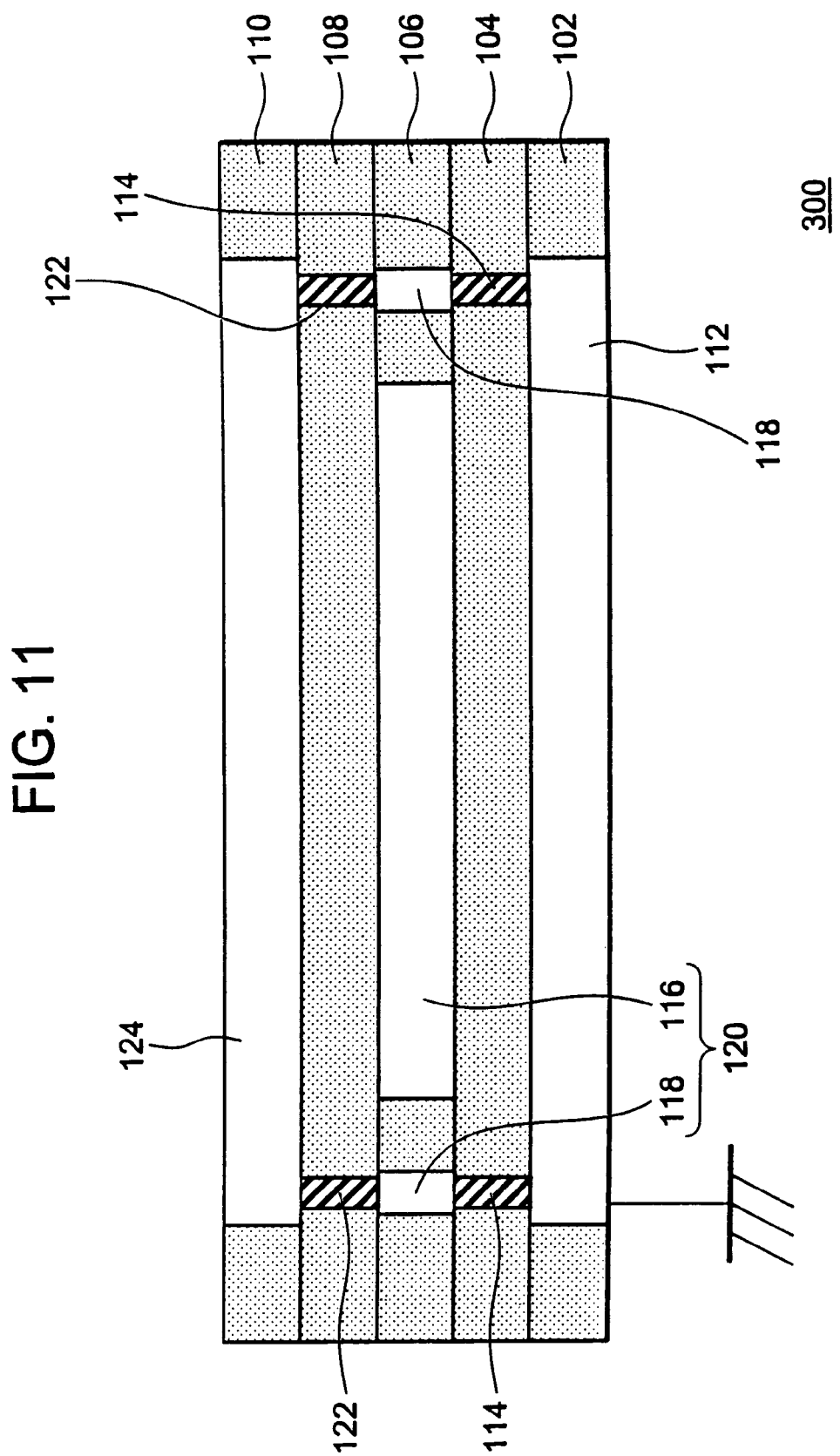
FIG. 11 is a cross-sectional view illustrating the semiconductor device according to the third embodiment of the present invention.
Figure 12:
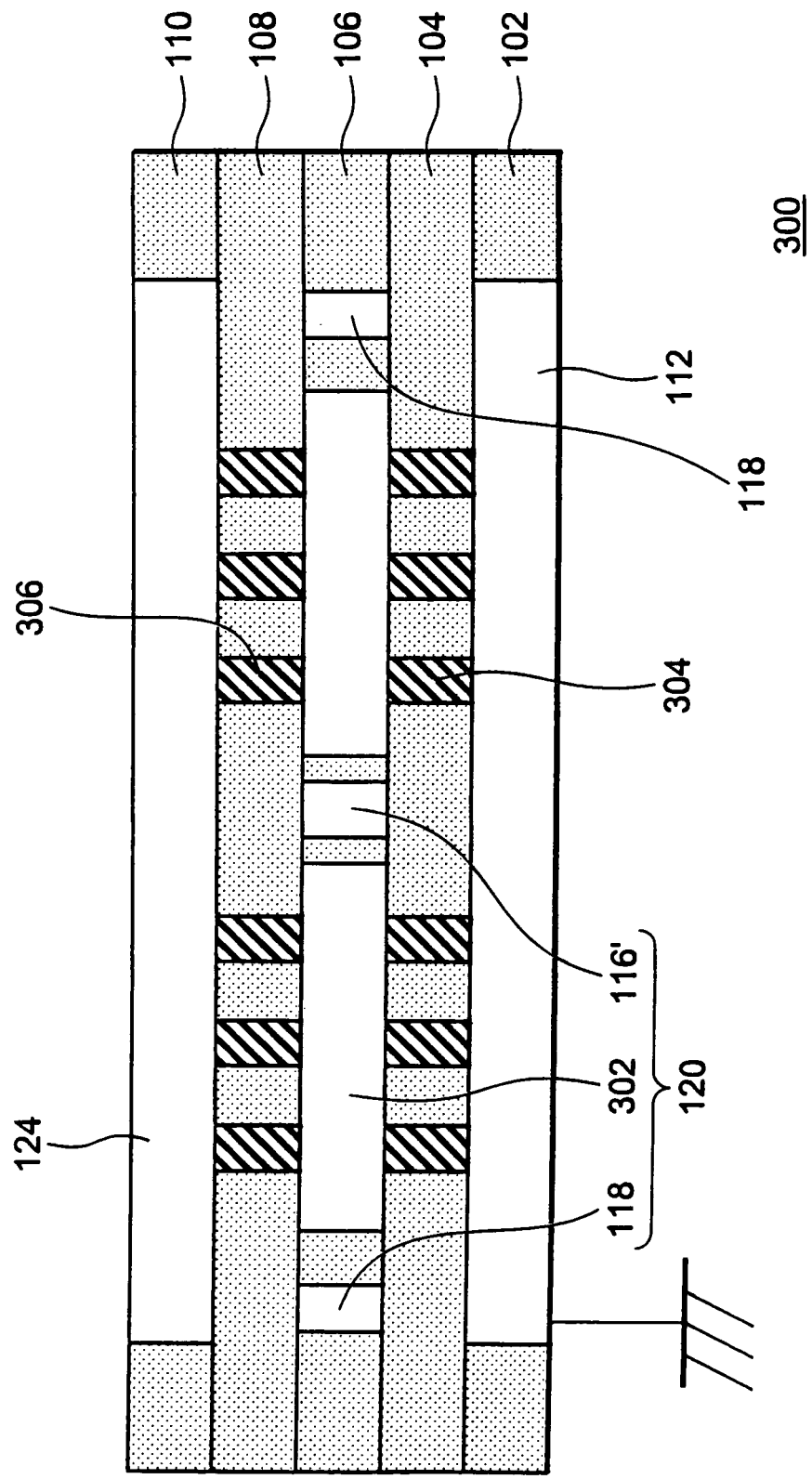
FIG. 12 is a cross-sectional view illustrating the semiconductor device according to the third embodiment of the present invention.

FIGS. 9 to 12 are views showing a third embodiment of the present invention. FIG. 9 is a plan view illustrating a semiconductor device 300 including a first capacitor 713 according to the third embodiment of the present invention; FIGS. 10A to 10C are plan views illustrating each of the wiring layers; FIG. 11 is a cross-sectional view along the line A-A' of FIG. 9; and FIG. 12 is a cross-sectional view along the line B-B' of FIG. 9.

The difference of the third embodiment from the first embodiment lies in that the upper electrode 124 and the lower electrode 112 constituting a first capacitor 713 are also electrically connected via a third via 304, a first shield line 302 and a fourth via 306. An explanation of other aspects not different from the first embodiment is omitted.

The semiconductor device 300 further includes, as illustrated in FIGS. 9 to 12, a first shield line 302 included in the second wiring layer 120, the third via 304 buried in the second interlayer insulating film 104 and used to electrically connect the lower electrode 112 and the first shield line 302, and the fourth via 306 buried in the fourth interlayer insulating film 108 and used to electrically connect the first shield line 302 and the upper electrode 124. The first shield line 302 is composed of copper or metal alloy made mainly of copper, for example. The third via 304 is composed of copper or metal alloy made mainly of copper, for example. The fourth via 306 is composed of copper or metal alloy made mainly of copper, for example. The first shield line 302 is arranged to both sides of the intermediate electrode 116 to extend in a direction orthogonal to the first shield line 118. That is, the upper electrode 124 is electrically connected to the lower electrode 112 via the first via 114, the first shield line 118 and the second via 122 and is also electrically connected to the lower electrode 112 via the third via 304, the first shield line 302 and the fourth via 306.

According to the present embodiment, in addition to the configuration of the first embodiment, the upper electrode 124 is electrically connected to the lower electrode 112 via the third via 304, the first shield line 302 and the fourth via 306. Thus, the intermediate electrode 116 can be surrounded on all four sides by the vias, so that effects of external noise on the MIM capacitor are further reduced.

Figure 13:
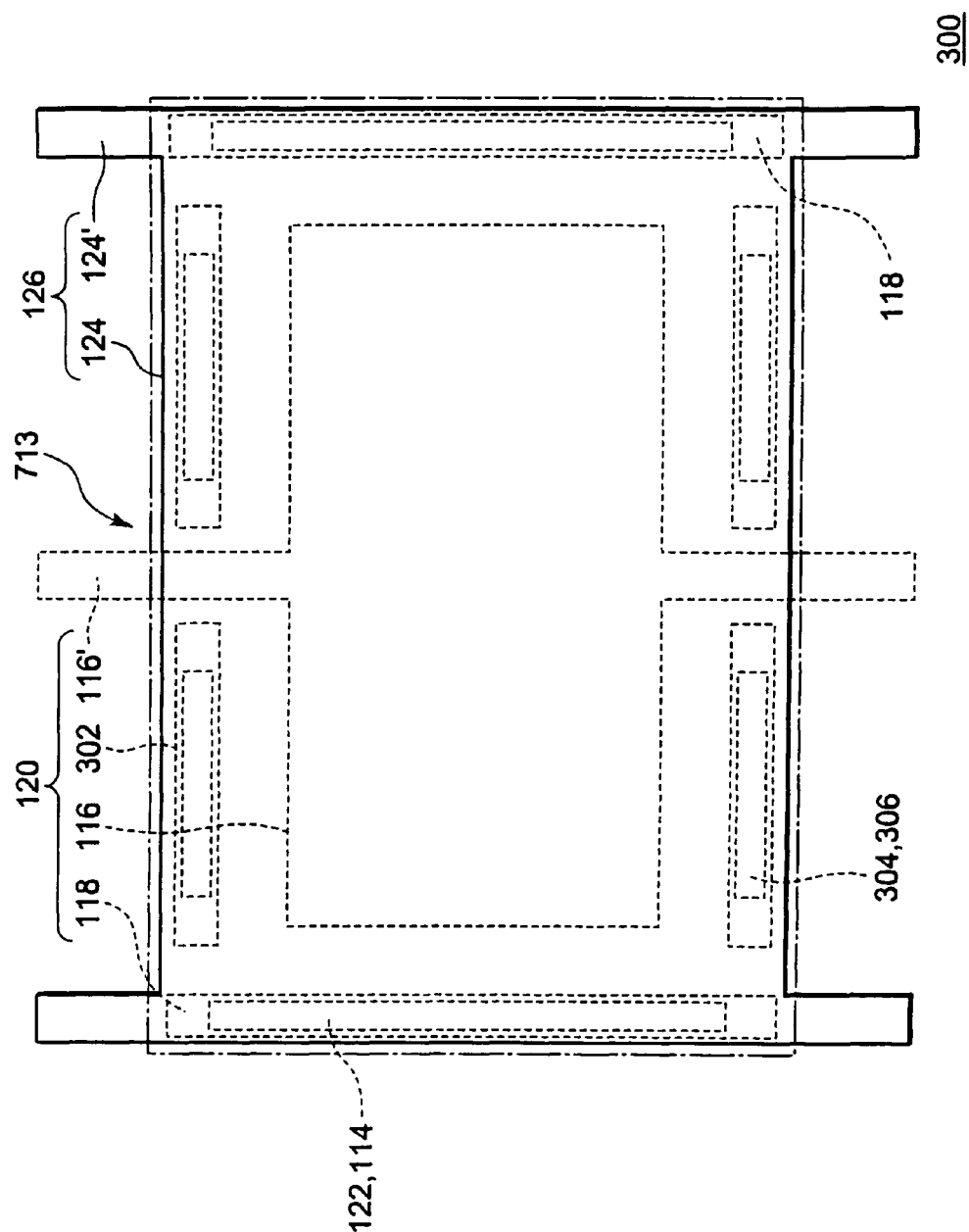
FIG. 13 is a plan view illustrating a variation of the semiconductor device according to the third embodiment of the present invention.

In the present embodiment, also, the vias 114, 122, 304 and 306 are each constituted of multiple rectangular vias. However, the vias 114, 122, 304 and 306 may be, as illustrated in FIG. 13, constituted of slit-shaped vias. When the vias 114, 122, 304 and 306 are constituted of slit-shaped vias, effects of internal and external noise on the capacitor are further reduced.

In the present embodiment, the intermediate electrode is rectangular, but not limited thereto; for example, when the intermediate electrode is hexagonal, the first shield line 302 can be arranged along a side adjoining that side of the intermediate electrode 116 facing the first shield line 118 of the intermediate electrode 116.

Fourth Embodiment

Figure 14A:
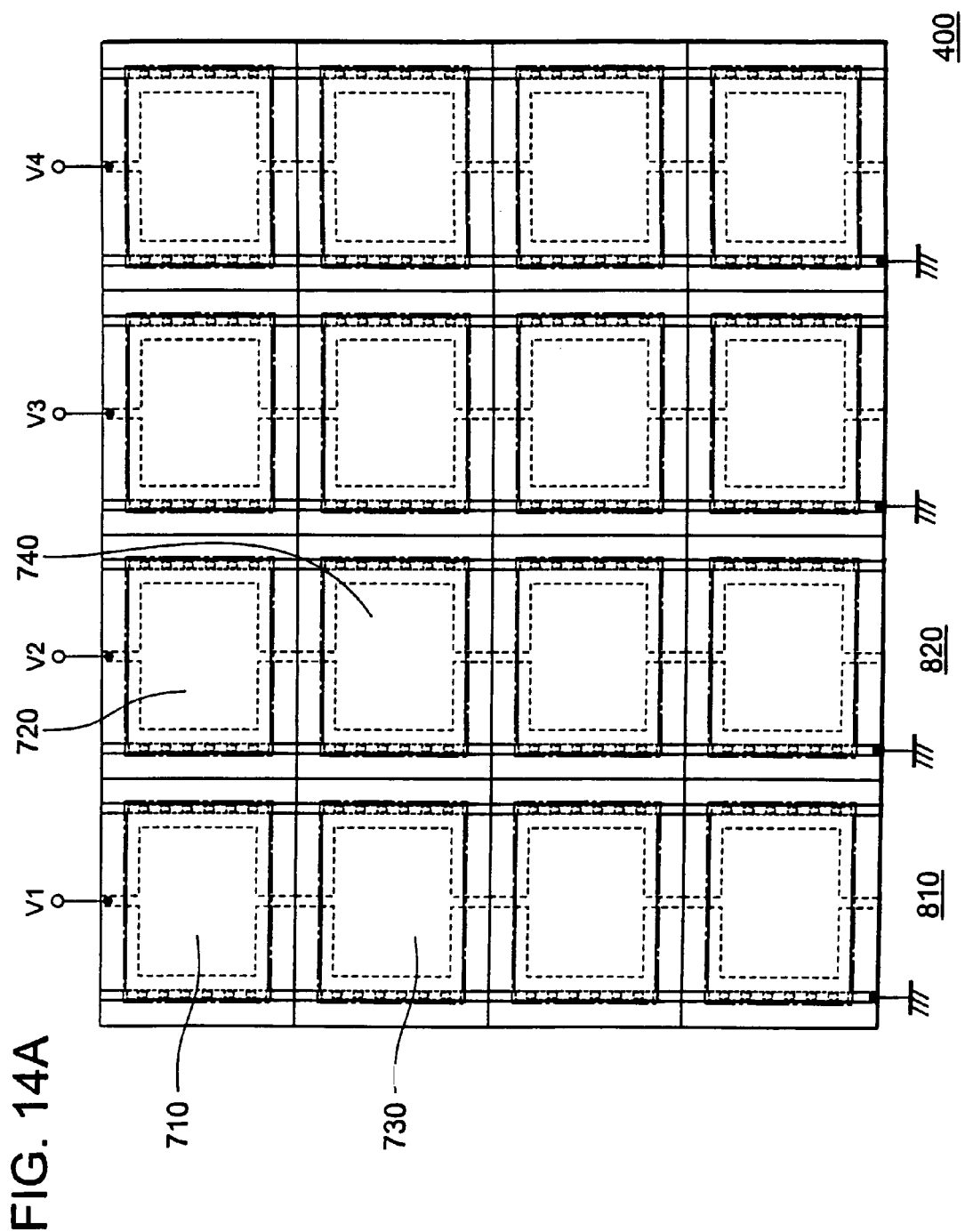
FIGS. 14A to 14C are plan views illustrating a semiconductor device according to a fourth embodiment of the present invention.
Figure 14B:
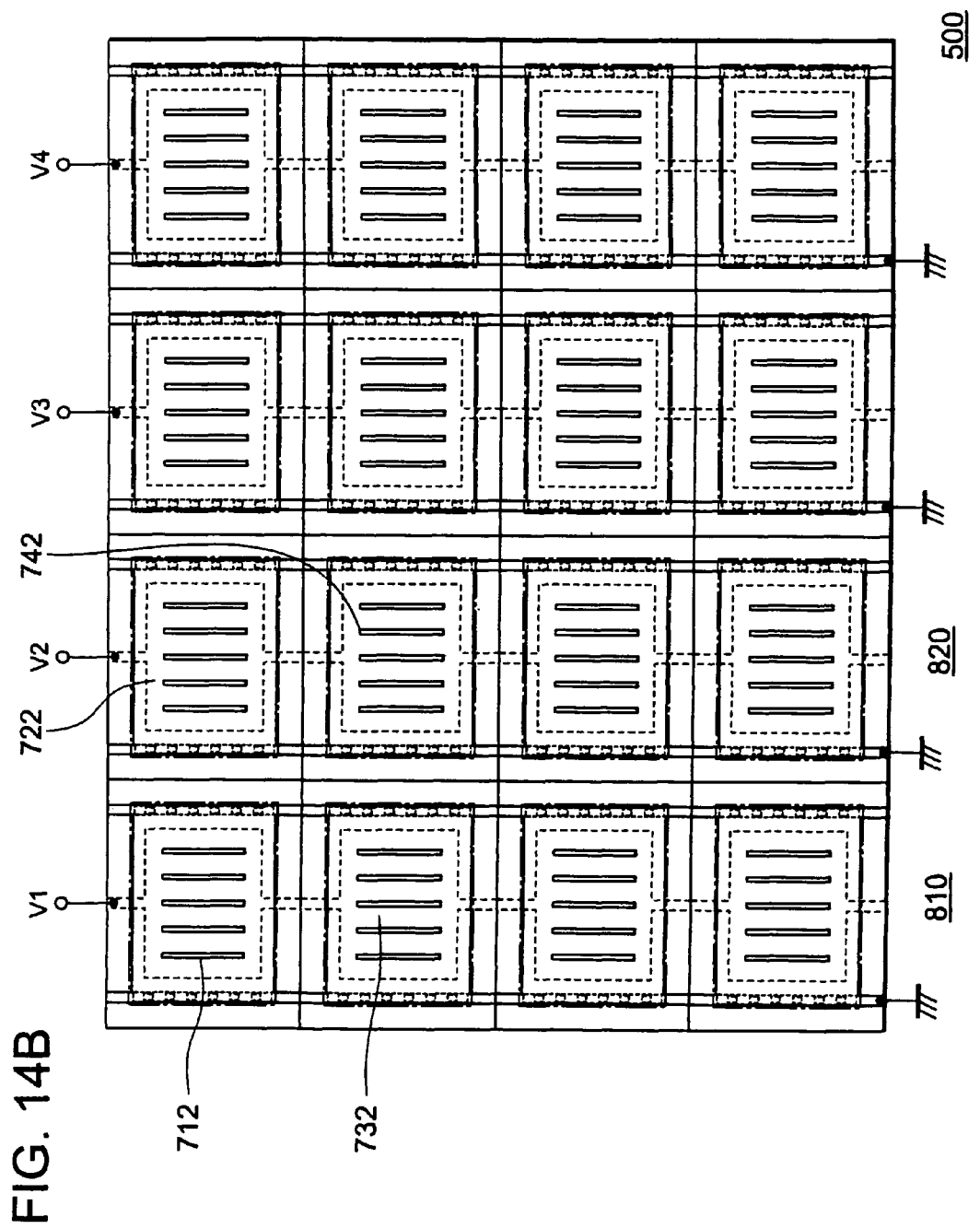
Figure 14C:
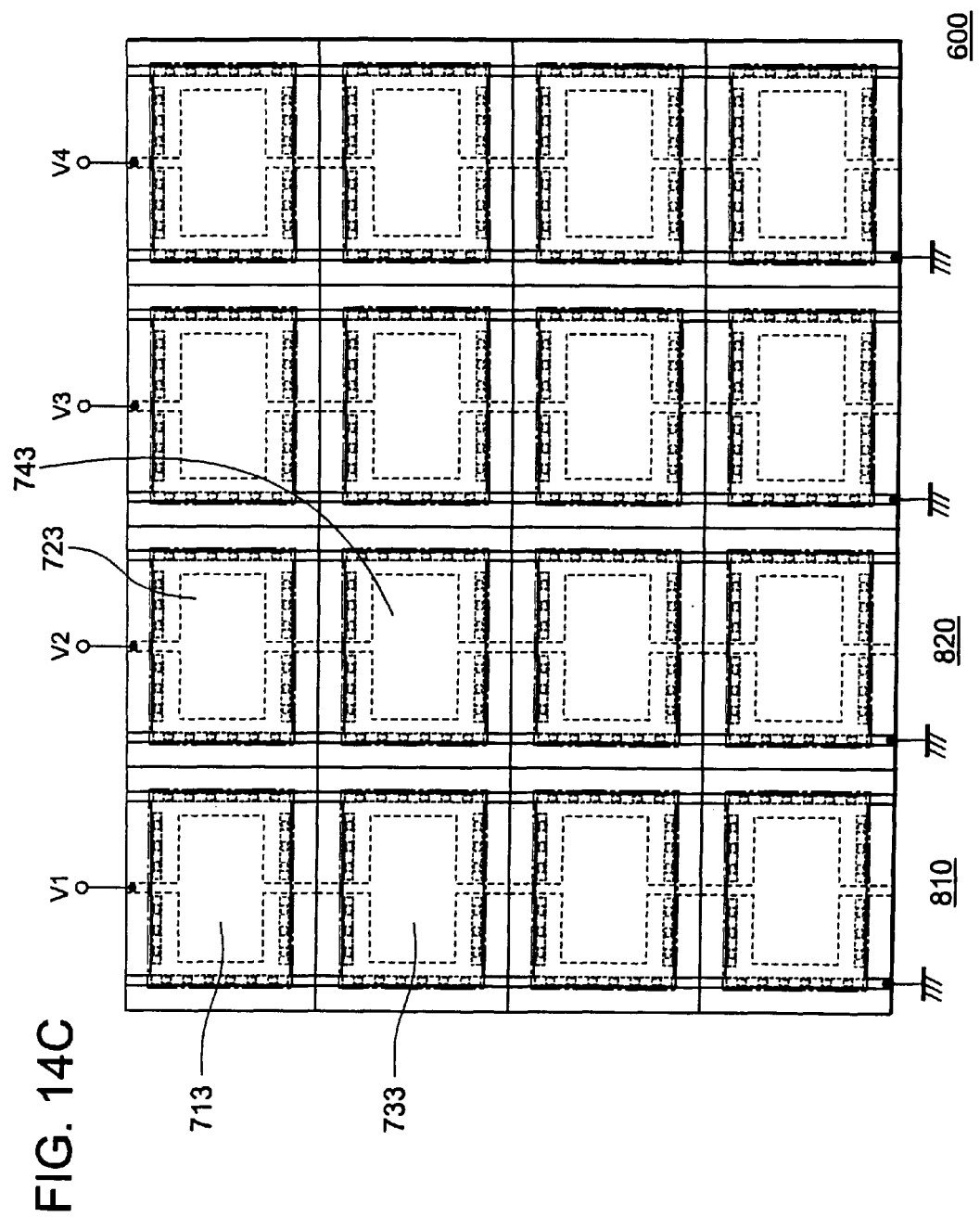

FIGS. 14A to 14C are views showing a fourth embodiment of the present invention. In the present embodiment, the MIM capacitor according to any of first to third embodiments is used as a unit capacitor, and the unit capacitor is arranged in a matrix shape.

FIG. 14A illustrates a semiconductor device 400 in which the capacitor 710 (refer to FIG. 1) according to the first embodiment of the present invention is used as a unit capacitor and arranged in a matrix shape. FIG. 14B illustrates a semiconductor device 500 in which the capacitor 712 (refer to FIG. 5) according to the second embodiment of the present invention is used as a unit capacitor and arranged in a matrix shape. FIG. 14C illustrates a semiconductor device 600 in which the capacitor 713 (refer to FIG. 9) according to the third embodiment of the present invention is used as a unit capacitor and arranged in a matrix shape.

Referring to FIG. 14A, the first capacitor 710 being a unit capacitor is mutually connected to a third capacitor 730 via the upper electrode withdrawing line 124' and the intermediate electrode withdrawing line 116' (refer to FIG. 1), whereby a first capacitor sequence 810 is constructed. The second capacitor 720 adjoining to the first capacitor is mutually connected to a fourth capacitor 740 via the upper electrode withdrawing line 124' and the intermediate electrode withdrawing line 116', whereby a second capacitor sequence 820 is constructed. The respective upper electrode withdrawing lines of the capacitor sequences are electrically connected to the ground electrode, and the upper electrode 124 electrically connected to the upper electrode withdrawing line, the second via 122, the shield line 118, the first via 114 and the lower electrode 112 are also fixed at the ground potential. However, the intermediate electrode withdrawing lines are electrically insulated from each other and can each have a different potential. According to the present embodiment, voltage V1 is applied to the first capacitor sequence, and voltage V2 is applied to the second capacitor sequence.

Referring to FIG. 14B, the capacitors 712 being each a unit capacitor are connected to each other via the upper electrode withdrawing line 124' and the intermediate electrode withdrawing line 116' (refer to FIG. 5). Referring to FIG. 14C, the capacitors 713 being each a unit capacitor are connected to each other via the upper electrode withdrawing line 124' and the intermediate electrode withdrawing line 116' (refer to FIG. 9).

According to the present embodiment, the capacitor according to any of first to third embodiments less affected by external noise is used as a unit capacitor and is arranged in a matrix shape. Consequently, when the noise level varies from region to region, also, a variation in capacitance value of the unit capacitor caused by noise can be reduced, so a high precision capacitor is provided and a high precision of capacitance ratio can be achieved.

Variation of Fourth Embodiment

FIG. 15 is a view illustrating the second wiring layer 120 according to a variation of the fourth embodiment. The difference from the fourth embodiment lies in that the respective shield lines 118 of the capacitors connected via the intermediate electrode withdrawing line 116' are also connected to each other.

According to the present embodiment, the first capacitor sequence and the second capacitor sequence extend in parallel with each other.

The present embodiment has the advantageous effects of the fourth embodiment. In addition, according to the fourth embodiment, the first shield line 118 lies between the intermediate electrode withdrawing line 116' connecting the first and second capacitors and the second intermediate electrode withdrawing line 116' connecting the adjoining capacitors. Consequently, effects of noise produced in the intermediate electrode withdrawing line 116' connecting the first and second capacitors on the second intermediate electrode withdrawing line 116' are reduced and thus a variation in capacitance value of the unit capacitor caused by noise is reduced. Accordingly, a high precision capacitor can be provided while excellent layout efficiency is achieved.

In this example, the configuration of a matrix (2×2) constituted of the first to fourth capacitors is illustrated in FIG. 15. However, the number of rows, the number of columns, or the number of rows and columns may be increased to two or more.

Further, in this example, the second wiring layer structure of the capacitor illustrated in FIG. 2B is used. Instead, the second wiring layer structure of the capacitor illustrated in FIG. 6B or FIG. 10B, or the structure having the shield line 118 formed, as illustrated in FIG. 16, in one side of the capacitor may be used.

It is apparent that the present invention is not limited to the above embodiments, but may be modified and changed without departing from the scope and spirit of the invention.

What is claimed is:

1. A semiconductor device, comprising:
   a first capacitor including a first upper electrode, a first lower electrode, a first intermediate electrode having a first width and arranged between the first upper electrode and the first lower electrode, and a first shield line having a second width in a same layer as the first intermediate electrode; and
   a second capacitor, including a second upper electrode, a second lower electrode, and a second intermediate electrode having a third width and arranged between the second upper electrode and the second lower electrode, and arranged adjoining to the first capacitor,
   wherein in the first capacitor and the second capacitor, the first upper electrode, the first lower electrode, the first shield line, the second upper electrode, and the second lower electrode are electrically connected to a ground electrode, and
   wherein the first shield line is arranged between the first capacitor and the second capacitor such that the first width and the third width are greater than the second width.

2. The semiconductor device according to claim 1, wherein the first intermediate electrode comprises a first side facing the second intermediate electrode, and
   wherein the first shield line is formed along the first side of the first intermediate electrode.

3. The semiconductor device according to claim 1, wherein the first intermediate electrode and the second intermediate electrode each have a different potential.

4. The semiconductor device according to claim 1, wherein the second capacitor includes a second shield line connected to the ground electrode in a same layer as the second intermediate electrode, and
   wherein the second intermediate electrode is formed between the first shield line and the second shield line.

5. The semiconductor device according to claim 1, wherein the first intermediate electrode comprises a first intermediate electrode withdrawing line, and the second intermediate electrode comprises a second intermediate electrode withdrawing line.

6. The semiconductor device according to claim 5, wherein the first shield line is elongated to shield the first intermediate electrode withdrawing line.

7. The semiconductor device according to claim 6, further comprising:
   a third capacitor which includes a third upper electrode, a third lower electrode, a third intermediate electrode arranged between the third upper electrode and the third lower electrode; and
   a fourth capacitor which includes a fourth upper electrode, a fourth lower electrode, a fourth intermediate electrode arranged between the fourth upper electrode and the fourth lower electrode,
   wherein the first intermediate electrode and the third intermediate electrode are connected via the first intermediate electrode withdrawing line, and
   wherein the second intermediate electrode and the fourth intermediate electrode are connected via the second intermediate electrode withdrawing line.

8. The semiconductor device according to claim 7, wherein the third upper electrode, the third lower electrode, the fourth upper electrode and the fourth lower electrode are electrically connected to the ground electrode.

9. The semiconductor device according to claim 8, wherein the first shield line is elongated to shield the third intermediate electrode.

10. The semiconductor device according to claim 7, wherein the first intermediate electrode and the second intermediate electrode each have a different potential.

11. The semiconductor device according to claim 7, further comprising:
    a first upper electrode withdrawing line formed in the same layer as the first upper electrode and connected to the first upper electrode; and
    a second upper electrode withdrawing line formed in the same layer as the second upper electrode and connected to the second upper electrode,
    wherein the first upper electrode and the third upper electrode are connected via the first upper electrode withdrawing line, and
    wherein the second upper electrode and the fourth upper electrode are connected via the first upper electrode withdrawing line.

12. The semiconductor device according to claim 11, father comprising:
    a first capacitor sequence including the first capacitor and the third capacitor; and
    a second capacitor sequence including the second capacitor and the fourth capacitor,
    wherein the first capacitor sequence and the second capacitor sequence extend in parallel with each other.

13. The semiconductor device according to claim 1, wherein the first shield line, the first intermediate electrode, and the second intermediate electrode extend in a first direction such that, in a second direction crossing the first direction, the first width and the third width are greater than the second width.

14. The semiconductor device according to claim 13, further comprising:
    a first electrode withdrawing line disposed in the same layer as the first intermediate electrode and electrically connected to the first intermediate electrode such that the first width is greater than a width of the first electrode withdrawing line; and
    a second electrode withdrawing line disposed in a same layer as the second intermediate electrode and electrically connected to the second intermediate electrode such that the third width is greater than a width of the second electrode withdrawing line.

15. The semiconductor device according to claim 13, wherein the first shield line is arranged, in the second direction, adjacent to the first intermediate electrode and the second intermediate electrode.

16. The semiconductor device according to claim 1, wherein the first width, the second width, and the third width extend in a same direction.

17. The semiconductor device according to claim 1, further comprising:
   a first insulating film disposed between the first upper electrode and the first intermediate electrode, and disposed between the second upper electrode and the second intermediate electrode; and
   a second insulating film disposed between the first lower electrode and the first intermediate electrode, and disposed between the second lower electrode and the second intermediate electrode.

18. The semiconductor device according to claim 17, further comprising:
   a third insulating film, disposed between the first insulating film and the second insulating film, the third insulating film abutting the first intermediate electrode, the second intermediate electrode, and the first shield line.

* * * * *